United States Patent [19]

Hoppe

[11] 4,031,391

[45] June 21, 1977

[54] ELECTRON MICROSCOPE INCLUDING IMPROVED MEANS FOR DETERMINING AND CORRECTING IMAGE DRIFT

[75] Inventor: Walter Hoppe, Martinsried near Munich, Germany

[73] Assignee: Max-Planck-Gesellschaft zur Forderung der Wissenschaften e.V., Gottingen, Germany

[22] Filed: June 21, 1976

[21] Appl. No.: 698,082

[30] Foreign Application Priority Data

July 1, 1975 Germany ........................... 2529735

[52] U.S. Cl. ................................ 250/311; 250/397
[51] Int. Cl.[2] ........................................ H01J 37/26
[58] Field of Search .......... 250/311, 306, 396, 397, 250/398, 491, 505; 346/33 A, 33 B

[56] References Cited

UNITED STATES PATENTS 3,700,895  10/1972  Dicke ............................. 250/505

Primary Examiner—Alfred E. Smith
Assistant Examiner—B. C. Anderson
Attorney, Agent, or Firm—Kenyon & Kenyon, Reilly, Carr & Chapin

[57] ABSTRACT

A corpuscular beam microscope, specifically an electron microscope, including means for adjusting the position of the object image in the microscope, and means, coupled to said adjusting means, for determining and correcting drift of the object image by means of a control signal which controls the adjusting means and is derived from a convolution of an actual object image with a stored reference object image. The improvement of the invention comprises the provision of means for deriving the convolution by imaging the actual object image directly on the reference object image.

A method for determining the convolution of the actual and reference object images in which the brightness values of the images are reduced to two values and the images are subsequently brought into coincidence is also disclosed.

15 Claims, 11 Drawing Figures

ELECTRON MICROSCOPE INCLUDING IMPROVED MEANS FOR DETERMINING AND CORRECTING IMAGE DRIFT

BACKGROUND OF THE INVENTION

1. Field of the Invention

This invention relates generally to corpuscular or charged-particle beam microscopes, such as electron microscopes, and in particular to corpuscular beam microscopes which include means for determining and correcting drift of the object image.

2. Description of the Prior Act

Corpuscular beam microscopes of the foregoing type are known in the art. For example, applicant's co-pending patent application Ser. No. 602,461 filed Aug. 6, 1975, now U.S. Pat. No. 3,971,936, discloses a corpuscular beam microscope which includes means for adjusting the position of the object to be imaged relative to the equipment axis of the microscope and/or relative to the focusing plane of the objective lens of the microscope on the object side and/or for changing the position of the object image relative to the equipment axis of the microscope. The microscope also includes means for controlling the condition or state of the object image by means of a control signal which is derived from a convolution of the actual object image with a stored reference object image. The control signal is utilized to control the adjusting means of the microscope and correct image drift in the microscope, and comprises a correlation signal which is derived from the instantaneous value of the correlation integral of an actual object image (the instantaneous microscope image) with a reference object image (a microscope image at an earlier instant in time).

The basic idea of the invention disclosed in the foregoing application is to correlate the instantaneous object image, known as the "actual object image", with a previous state of itself, known as the "reference (or desired) object image". The convolution operation is performed in the microscope with the reference object image rotated 180° relative to the actual object image about a normal to the plane of the image. Mathematically, this convolution operation is carried out by calculating the integral $P_{u,v}$ with $P_{u,v} = \int f(x,y) f'(x+u, y+v) dx dy$, where $f$ represents the actual object image, $f'$ represents the reference object image, and u,v represents the line segments in the direction of the coordinate axes by which the reference object image is displaced relative to the actual object image. The integral $P_{u,v}$ is known as the "correlation integral". This integral has its maximum value when there is substantial coincidence between the actual and the reference object images, i.e., when the reference object image is in approximate registration with the actual object image. This maximum value of the correlation integral is known as the correlation maximum.

In one embodiment of the invention disclosed in applicant's foregoing co-pending application, a control variable or signal is utilized to control the positioning devices of the microscope which is derived from the correlation maximum. The correlation maximum is formed in this case by a light-optical device at a point of a planar detector. The reference object image, which is realized as a light relay, e.g., a photographic plate, is illuminated by the acutal object image. The actual object image, the reference object image, and the detector of the microscope are disposed along an optical axis at predetermined, fixed distances from each other, and the planes of the two images and the detector are perpendicular to this axis.

If the origins of the reference and actual object images lie on the optical axis, then the correlation maximum will be located at the point where the optical axis passes through the surface of the detector. If the actual object image is displaced perpendicular to the optical axis, however, the correlation maximum will lie outside the optical axis. The location of the correlation maximum on the planar detector is, thus, an indication of the displacement of the actual object image relative to the reference object image.

SUMMARY OF THE INVENTION

It is therefore an object of the present invention to provide a corpuscular beam microscope including an improved means for determining and correcting image drift in such a microscope.

It is also an object of the present invention to provide a corpuscular beam microscope in which a control signal is utilized to adjust the position of the object in the microscope which is derived directly from the instantaneous value of the correlation integral.

These and other objects are achieved by the present invention in a corpuscular beam microscope including means for adjusting the position of the object image in the microscope, and means for determining and correcting drift of the object image by means of a control signal which controls the adjusting means and is derived from a convolution of the actual object image with a stored reference object image. The improvement of the invention comprises the means for determining and correcting including means for deriving the convolution by imaging the actual object image directly on the reference object image.

The present invention is based on the discovery that the instantaneous value of the correlation integral, as well as the location of the correlation maximum, are an indication or measure of the displacement of the actual object image relative to the reference object image. The correlation integral of the actual and the reference object image may be calculated in different ways. For example, the actual object image may be in the form of a radiation-emitting actual object image. In this case, the reference object image is stored on a radiation-impermeable substrate, such as the storage screen of an image correlation tube or the photographic plate of an image amplifier tube, and a detector is used to determine the total radiation passing through the reference object image. The amount of radiation measured by the detector is directly proportional to the correlation integral. The detector utilized may comprise a planar detector having an area which is at least equal to that of the actual and reference object images. Alternatively, the detector may comprise an approximately punctiform detector on which the electron beam radiation passing through the reference object image is focused by suitable means.

The actual object image can also be imaged on the reference object image by an electron-optical device. In this case, an electron-optical image correlation tube, which is known in the art, can be utilized. A typical tube is described in ITT publication "See Saw Image Correlation Tubes" (August 1974). The image correlation tube has a storage screen, on which the reference object image is stored, and a photocathode which receives the actual object image. The correlation tube may also have suitable deflection means, such as deflection coils or plates, for displacing the actual object image in defined distance increments. Such deflection means permit the maximum value of the correlation integral, i.e., the correlation maximum, to be determined.

It can be demonstrated that the correlation maximum is present if the random displacement of the actual object image by the deflection means is equal and opposite to the predetermined displacement of the actual object image relative to the reference object image. Thus, in one embodiment of the present invention, the output signal of the previously-described radiation detector, which detects the total radiation passing through the reference object image, is applied as a brightening signal to a television display tube, i.e., a cathode ray tube, the electron beam of which is controlled in accordance with the random deflection of the actual object image. An image with a defined brightness maximum will be produced on the screen of the tube and this maximum will correspond to the correlation maximum. By using a suitable detector, for example, a detector matrix of light-sensitive elements disposed in front of the screen of the display tube, the location of the brightness maximum on the screen can be determined and the control signal derived therefrom.

Instead of using the above-described television tube and detector matrix arrangement to determine the correlation maximum, however, an electronic circuit may be utilized. The instantaneous values of the random displacement of the actual object image and the output signal of the detector, which measures the radiation passing through the reference object image, are transmitted to this electronic circuit as input signals. The output signals of the circuit will then represent the coordinates at which the output signal of the detector will have its maximum.

The imaging of the actual object image on the reference object image may also be effected by light-optical means instead of the electron-optical means described above. In such an arrangement, the actual object image comprises a light-emitting actual object image and the substrate upon which the reference object image is stored will comprise a light-permeable film, for example, a photographic plate. The actual object image is generated on the picture display screen of an image amplifier tube, which tube may include means for displacing the actual object image in defined distance increments, such as, for example, magnetic deflection coils or static deflection plates disposed in the beam path of the image amplifier tube. The output signal of the detector, which in this arrangement determines the amount of light behind the reference object image, may be applied to a television display tube for determining the correlation maximum. The tube may be controlled in accordance with the random deflection of the actual object image in the manner previously described herein.

The value of the correlation integral can be easily determined after manipulating the actual and reference object images by reducing the brightness values of the images to two values: "0" or "1". In this situation, only those coordinate points (x,y) at wich the functions $f(x,y)$, the actual object image, and $f'(x,y)$, the reference object image, have the value 1 will contribute to the correlation signal. All other coordinate points will not contribute to the correlation integral, and it is, thus, possible to simulate the calculation of the integral by summing the actual and the reference image. This is so, since if the values of the integrand which can be used in the calculation of the integral, namely, $0.0 = 0$; $0.1 = 0$; $1.0 = 0$; and $1.1 = 1$, are compared with the total of the sum of the factors $f(x,y)$ and $f'(x,y)$ of the integrand, namely, $0 + 0 = 0$; $0 + 1 = 1$; $1 + 0 = 1$; and $1 + 1 = 2$, it can be seen that the total "2", which is different from each of the corresponding totals of the other values of the integrand, corresponds to the integrand value 1.1, which by itself is important for the integration. The images modified as described above are then brought into coincidence on a planar detector. If, for example, the detector comprises the light-sensitive surface of a camera tube which responds only to a brightness value which is larger than a maximum brightness value 1 of one image, than the value of the correlation integral can be determined in a particularly simple manner, since the correlation integral will be proportional to the output signal of the camera tube.

A different method for determining the correlation integral by a summation of the actual and reference object images is as follows:

The actual and reference object images are first reduced to two brightness values 0 and 1, and are reversed as to contrast. The images are then brought into coincidence on a planar detector. The correlation integral will then be directly proportional to the number of points of the detector at which the brightness value 0 is present. This number of points is equal to the difference of the total number of points of the detector and the number of points where a brightness value of 1 or 2 exists. The correlation integral is then determined by means of a detector having a saturation characteristic which causes saturation to occur at a brightness value which is equal to the maximum brightness value 1. In such a case, the difference of two brightness values of the entire detector surface will correspond to the correlation integral. One of these values will be the brightness that exists when a brightness of 1 or 2, i.e., saturation, exists at all points. The other value will be the instantaneous value of the detector surface.

Detectors having a saturation characteristic of the foregoing type may comprise, for example, a fluorescent film or a light-sensitive surface of a camera tube. Since the brightness of the fluorescent film may be measured in different ways, the detector may be coupled optically to the light entrance plane of a camera tube which does not receive light directly emanating from the actual and reference object images. Also, the detector may be preceded along the beam path by a first filter and followed along the beam path by a second filter. The first filter will absorb the light located within the fluorescence region of the film, while the second filter will pass only the light located within the fluorescence region of the film.

These and other novel features of the invention will be described in greater detail herein in the following detailed description.

BRIEF DESCRIPTION OF THE DRAWINGS

In the drawings, wherein similar reference numerals denote similar elements throughout the several views thereof:

FIGS. 7b and 7c are graphical illustrations of different saturation characteristics for the camera tube illustrated in FIG. 7a;

DETAILED DESCRIPTION

Figure 1:
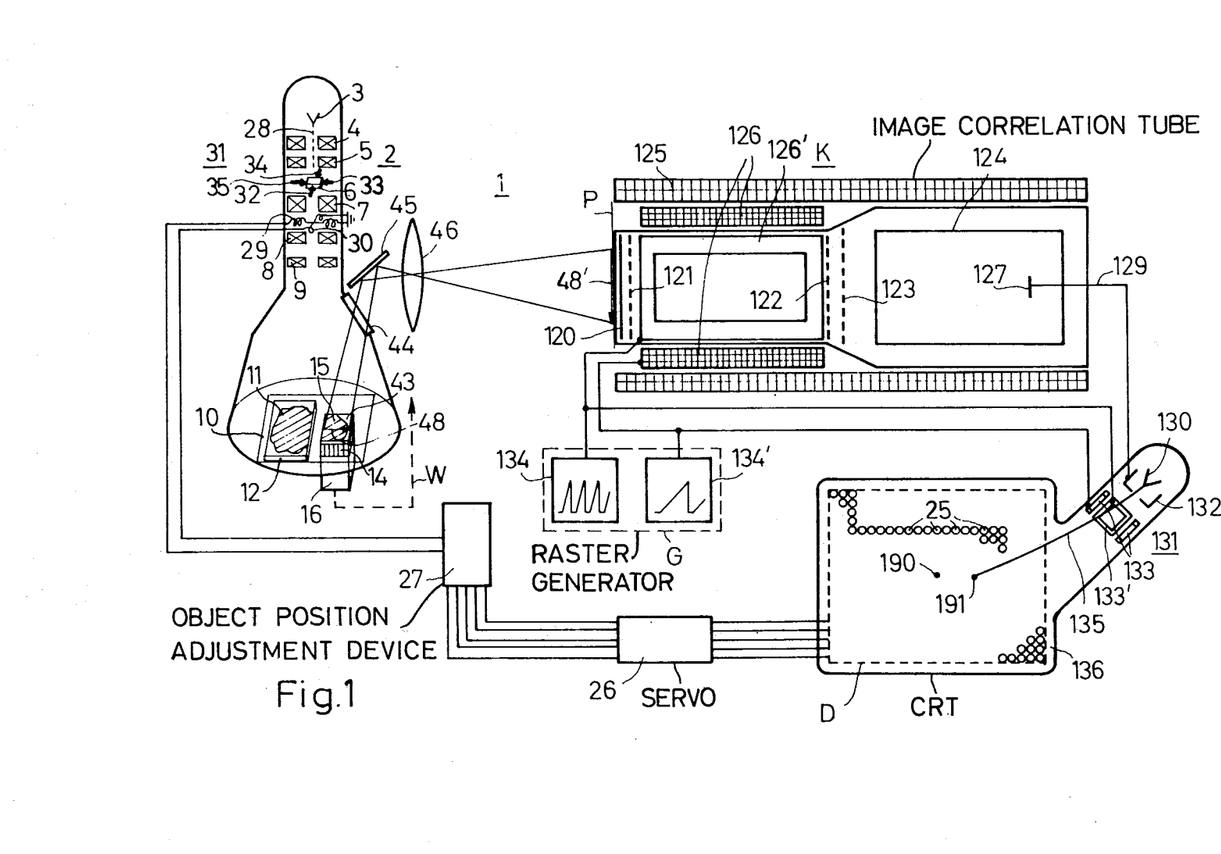
FIG. 1 is a schematic diagram of one embodiment of a corpuscular beam microscope including an improved means for determining and correcting image drift in the microscope which utilizes an electron-optical correlation tube to determine the correlation integral from the actual and the reference object images, constructed in accordance with the present invention.

Referring now to the drawings, and in particular to FIG. 1, there is shown an electron-optical computer, identified by the reference numeral 1, for determining and correcting the image drift of an electron microscope 2. The microscope comprises an electron source 3, condenser lenses 4 and 5 for illuminating an object 6 which is to be examined, an objective lens 7, an intermediate lens 8, and a projector lens 9. The projector lens generates an image of object 6 in the image plane 10 of the microscope 2 and a portion 11 of this image is recorded on a photographic plate 12. A directview fluorescent screen 43, on which an additional portion 15 of the object image is produced, is disposed adjacent the photographic plate. The microscope image 15 of object 6, which is represented by arrow 48, is projected through an optical window 44 of the microscope 2 onto a mirror 45 and through an optical lens 46 into the plane P wherein image 15 is represented by arrow 48'.

If the entire image generated in image plane 10 of microscope 2 is caused to drift, the two partial images 11 and 15 will be displaced in the same manner. Thus, the stationary position of partial image 11 during exposure of photographic plate 12 by partial image 15 can be determined by correlating partial image 15 with a previous condition or state, i.e., position, of itself. The formation of the correlation integral for making the foregoing determination is achieved by means of an electrical-optical image correlation tube K, the construction and operation of which is as follows:

Tube K includes a photocathode 120, an accelerating grid 121, a collector grid 122, a storage screen 123 and a secondary electron multiplier 124. The tube is surrounded by a cylindrical focusing coil 125 which focuses electrons emitted from each point of photocathode 120 on a corresponding point of storage screen 123. Photocathode 120 is disposed in the Plane P, and the optical input image to the tube, image 48', is converted therein into an electron-optical image. Electrons leaving photocathode 120 are drawn off by accelerating grid 121, pass through the accelerating grid, and proceed, in a path parallel to the axis of the correlation tube, to storage screen 123. The storage screen may comprise, for example, a metallic support screen of very fine wire on which a layer of high-resistance material is disposed.

Correlation tube K has three operating modes: "store", "erase", and "read". In the "store" operating mode, a positive voltage of about 500 volts is applied between photocathode 120 and storage screen 123. The photoelectrons generate secondary electrons on the surface of storage screen 123, and these secondary electrons are drawn off by collector grid 122. The surface of storage screen 123 is thereby positively charged to different degrees at different points on the surface of the screen depending upon the number of photoelectrons which strike the screen. The optical input image to the tube is thus imaged on storage screen 123 as a charge distribution. This stored image information is erased in the erase operating mode of the tube by applying a positive voltage of several volts, e.g., 10 volts, between photocathode 120 and storage screen 123. The energy of the photoelectrons will then be insufficient to generate secondary electrons, and the entire surface of storage screen 123 will be uniformly charged to the potential of the photocathode. In the read operating mode of the tube, a negative voltage of a few volts, e.g., −5 volts, is applied between photocathode 120 and storage screen 123. The storage screen will then be partially permeable to the passage of electrons, and the more positive the surface of the screen is charged, the more permeable the screen will be to the passage of electrons. The storage screen is, thus, transparent to the photoelectrons to locally different degrees on its surface depending upon the stored charge distribution. The charge distribution on the surface of the screen does not change in the read mode of operation, since the surface of the screen is negative relative to photocathode 120 and the photoelectrons cannot impinge upon it.

The correlation integral is calculated in image correlation tube K from the actual and the reference object images as follows:

First, the "reference object image" is generated as the first object image on storage screen 123. The correlation tube operates in its storage mode to achieve this. Next, the object image is imaged at a latter point in time as the "actual object image" on photocathode 120. In the "read" operating mode of the tube, the electron distribution generated behind photocathode 120 is magnetically focused onto storage screen 123. Since screen 123 is permeable to electrons to locally different degrees, an electron flux is produced behind the screen which corresponds to the correlation integral of the two images. Electrons passing through storage screen 123 are collected and amplified by secondary electron multiplier 124. A signal is then obtained at the output 129 of correlation tube K which is proportional to the correlation integral of the actual and the reference object images.

The maximum of the correlation integral and, thus, the displacement of the actual object image relative to the reference object image, is determined by utilizing additional devices in conjunction with the correlation tube. For example, two pairs or deflection coils 126 and 126' may be disposed on the neck of the image correlation tube in saddle-fashion. These deflection coils are effective at right angles with respect to each other and perpendicular to the longitudinal axis of the correlation tube. The coils enable the entire input image to tube K, converted by the photocathode into an electron-optical image, to be displaced in two mutually perpendicular directions. A television display tube 131, i.e., a cathode ray tube, is coupled to the output of the correlation tube. The television tube, which has been illustrated in schematic form only for the purposes of simplicity, comprises an electron source 130, a control grid 132, and a pair of deflection coils 133 and 133'. The control grid 132 is coupled to output 129 of correlation tube K. Deflection coils 126 and 126' and 133 and 133' are synchronously excited by a raster generator G. This generator consists of a pair of sawtooth generators 134 and 134' which respectively control the horizontal and vertical deflection of the actual object image and the electron beam 135 of television display tube 131.

If the actual object image emanating from photocathode 120 is deflected relative to the reference object image impressed upon storage screen 123 by means of raster generator G, an image is generated on screen 136 of tube 131 by electron beam 135 which has a point of extreme brightness. The location of this point of brightness is an indication or measure of the drift of the actual object image relative to the reference object image. The brightness of the point corresponds to the value of the maximum of the correlation integral, i.e., the correlation maximum. If deflection coils 133 and 133' of television tube 131 are controlled so that the correlation maximum lies in the center 190 of the television tube screen when the actual object image is not displaced, i.e., the image has not drifted, then the deviation of the correlation maximum 191 from the center of the television tube screen will be directly proportional to the drift of the actual object image.

The location or position of the correlation maximum can be determined by a location-sensitive planar detector. Such a detector may comprise an area pattern of photoelectric elements, for example, photodiodes 25. These photodiodes are disposed in a plane D immediately in front of screen 136 of tube 131. The photodiodes are coupled to servo devices 26 by means of which the drift of the microscope image is corrected.

Image drift correction is accomplished by means of an adjusting means which adjusts the position of the object image in the microscope, specifically position adjusting devices 27 coupled to servo devices 26 which adjust the position of the object 6 relative to axis 28 of microscope 2 and/or relative to the focusing plane of objective lens 7 on the object side and/or by adjusting the position of the object image relative to equipment axis 28.

Adjustment of the position of the object image relative to equipment axis 28 may be effected by means of voltage sources (not shown) controlled by servo devices 26 which are coupled to and excite two pairs of deflection coils 29 and 30 arranged in perpendicular relationship to each other in the microscope. By using this arrangement, a fine displacement of the microscope image can be achieved for correcting small image drifts by deflecting the imaging ray bundle.

In order to adjust the position of object 6 relative to microscope axis 28, adjusting means, generally designated by the reference numeral 31, may be provided. This means comprises four plungers 32, 33, 34 and 35 which displace object 6 in two directions perpendicular to equipment axis 28. Since displacement of the object by the plungers is mechanical and, therefore, is relatively inaccurate, this type of adjustment of the position of object 6 will generally be made only when there have been large drifts of the microscope image. Smaller image drifts are corrected by means of coils 29 and 30 in the manner previously described herein.

Adjustment of the position of object 6 relative to the focusing plane of the objective lens on the object side can be effected either by varying the excitation of objective lens 7 or by mechanically raising or lowering object 6 in the direction of equipment axis 28. Suitable apparatus for raising or lowering object 6 are known in the art and, accordingly, are not illustrated or described herein.

The embodiment of the invention illustrated in FIg. 1 is susceptible to several variations in design. For example, an image amplifier tube may be used to generate the optical input image to correlation tube K instead of the light-optical system comprising optical window 44, mirror 45, and optical lens 46. Also, partial image 15 may be generated on a rear-view fluorescent screen to which a fiber optic system 14 is coupled, instead of on directview fluorescent screen 43. In such an arrangement, the fiber optics system transmits the partial image to the photocathode of the image amplifier tube, and the latter then generates partial image 15 on its display screen which is disposed in plane P.

An image storage tube which generates a stationary image on its fluorescent screen may also be utilized in place of the foregoing light-optical system. The actual object image can then be held, i.e., stored, at predetermined time intervals and the maximum of the correlation integral is determined from the reference object image and the respective actual object images. The instantaneous drift of the microscope image is determined by comparing the location of the correlation maxima.

Figure 2:
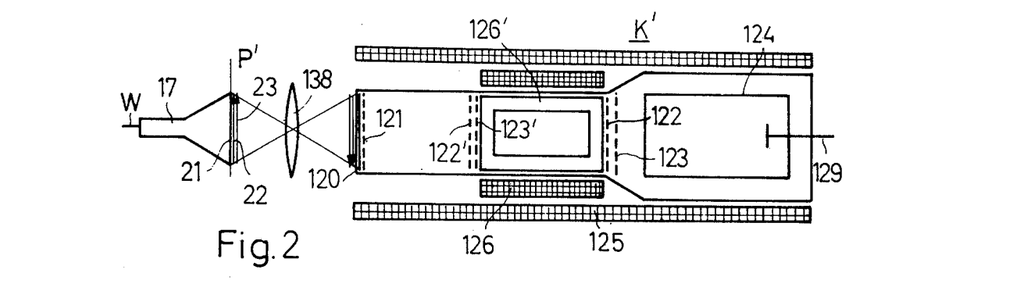
FIG. 2 is a partial schematic diagram of another embodiment of the microscope illustrated in FIG. 1.

A stationary actual object image which is suitable for forming the correlation integral can also be generated from an image reproduced in a television display tube, i.e., a cathode ray tube, shown in FIg. 2. In this embodiment of the invention, partial image 15 is generated on a transparent, i.e., rear-view fluorescent screen which is substituted, as previously described herein, for direct, i.e., front-view, fluorescent screen 43. This image is transmitted by means of fiber optics 14 to a television camera 16 (shown in FIG. 1) which subsequently transmits the image to a television display tube 17 controlled by the camera by means of function line W. The image present on screen 21 of television display tube 17 is projected optically by a lens 138 onto photocathode 120 of an image correlation tube K', which is substantially the same as correlation tube K illustrated in FIG. 1 (similar reference numerals denote similar elements in the two figures), but which also includes an additional storage screen 123' disposed between accelerating grid 121 and storage screen 123 and an additional collector grid 122' disposed in front of storage screen 123'. The operation of storage screen 123' and of collector grid 122' is the same as that of storage screen 123 and collector grid 122.

In operation of this embodiment of the invention, the reference object image, which is represented by arrow 22, reproduced on television screen 21 is first impressed upon storage screen 123, as in the operation of correlation tube K. Next, the actual object image, which is represented by arrow 23, is transmitted to photocathode 120 by means of television display tube 17 and is subsequently stored on storage screen 123'. The correlation integral of the actual object image, which is in the form of a stationary electron-optical image, and the reference object image, which also is in this form, is then generated by uniformly illuminating the area of photocathode 120 by a light source (not shown) and setting the correlation tube K' to its read operational mode (which corresponds to the "read" operational mode in correlation tube K). A signal is then obtained at the output 129 of correlation tube K' which corresponds to the correlation integral of the two images. If the electrons passing through storage grid 123' are deflected by deflection coils 126 and 126' in the same manner as in correlation tube K, and the output signal of image correlation tube K' is processed in the same manner as the output signal of correlation tube K, the correlation maximum can again be determined.

Figure 3:
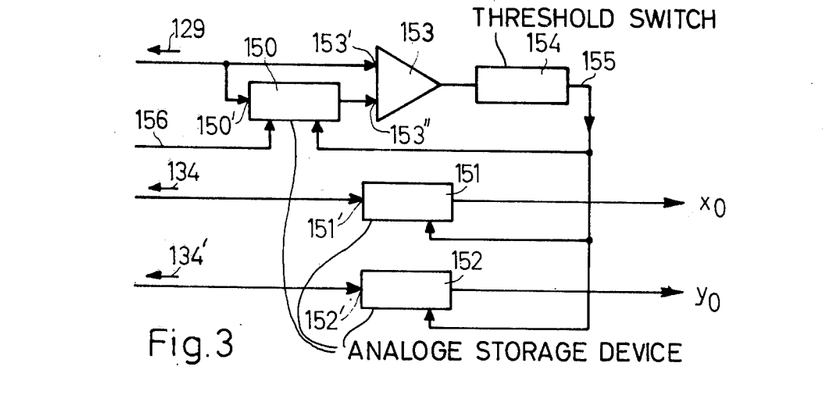
FIG. 3 is a schematic circuit diagram of an electronic circuit which may be used to determine the location of the maximum of the correlation integral in a microscope constructed in accordance with the present invention.

The correlation maximum can also be determined by means of an electronic circuit such as that illustrated in FIG. 3. This circuit comprises analog storage devices 150, 151 and 152, an operational amplifier 153, and a threshold switch 154 electrically interconnected as shown in the drawings. The output signal of either correlation tube K or K' is transmitted to input 153' of amplifier 153 and to input 150' of storage device 150. The output of device 150 is coupled to the second input 153'' of operational amplifier 153, and inputs 151' and 152' of devices 151 and 152 are coupled to sawtooth generators 134 and 134' of raster generator G. Amplifier 153 compares the output signal of the correlation tube, which is in the form of a voltage, with the value of the voltage stored in device 150. If the output voltage of the correlation tube is greater than the stored voltage value, the amplifier transmits a signal to threshold switch 154. The threshold switch is connected to and transmits storage instruction signals to analog storage devices 150, 151 and 152. Storage device 150 stores the actual value of the output voltage of the correlation tube, and devices 151 and 152 store the instantaneous value of the associated sawtooth generators 134 and 134'. The voltage stored in device 150 comprises the reference signal to which the next arriving output signal of the correlation tube is compared.

After an image cycle is terminated, i.e., after the running time of the line advance generator 134' is over, the location $x_0$, $y_0$ of the autocorrelation maximum is stored in analog form in storage devices 151 and 152. Deviations of the locations $x_0$ and $y_0$ from the location in the case where there is no image drift can be corrected by means of position adjusting devices 27 as described with reference to the embodiment of the invention illustrated in FIG. 1.

An erase pulse transmitted to analog storage device 150 through a line 156 is used to reset the circuit. This erase pulse cancels the actual value of the output voltage of the correlation tube stored in device 150. The circuit is then ready for the evaluation of the correlation maximum for another reference object image.

Figure 4:
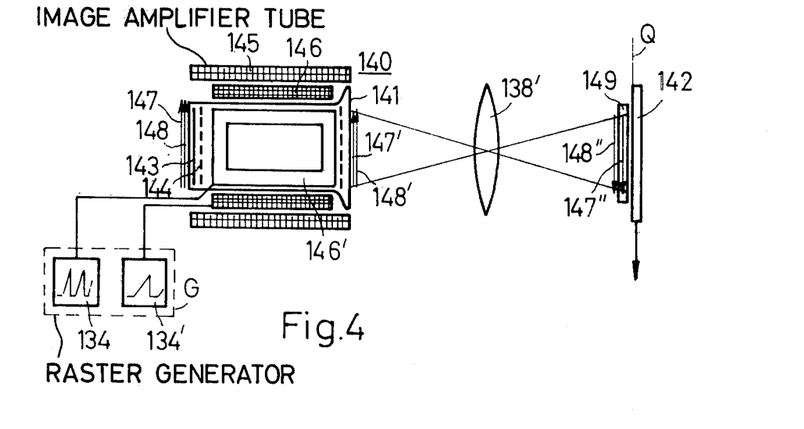
FIG. 4 is a partial schematic diagram of another embodiment of a microscope constructed in accordance with the present invention in which the correlation integral is determined by a light-optical device.

FIG. 4 illustrates an embodiment of the invention in which the correlation integral of the reference and actual object images is determined by light-optical means. In this embodiment, the output image of an image amplifier tube 140 is projected onto a plane Q by means of a light-optical system, illustrated as optical lens 138', which is schematically illustrated in the drawing. A planar detector 142 is disposed in plane Q and determines the total amount of radiation in the plane. Tube 140 comprises a photocathode 143 followed by an accelerating grid 144, a focusing coil 145 and two pairs of deflection coils 146 and 146' disposed on the neck of the tube in saddle-fashion. The deflection coils act in directions perpendicular to each other and are controlled by a raster generator G. This generator is the same as the raster generator described with reference to the embodiment of the invention illustrated in FIG. 1. Coils 146 and 146' enable the image impressed upon photocathode 143 and cnverted by the photocathode into an electron-optical image to be displaced.

In operation, the reference object image, which is represented by arrow 147, is first stored on photocathode 143. Next, image amplifier tube 140 generates this image on its fluorescent screen 141. The image generated by the amplifier tube is represented by arrow 147'. Reference object image 147' is then transferred by means of light-optical system 138' to plane Q and is stored as a positive image, represented by arrow 147'', on a photographic plate 149 disposed in this plane. Subsequently, the actual object image, represented by arrow 148, is impressed upon photocathode 143 as a static image and is transferred into plane Q in the same manner as the reference object image. The actual object image, represented by arrow 148'', illuminates the reference object image stored on photographic plate 149. A signal is then generated at the output of detector 142 which is proportional to the correlation integral of the actual and reference object images.

When deflection coil pairs 146 and 146' are excited by sawtooth generators 134 and 134' of raster generator G, actual object image 148'' will be displaced on fluorescent screen 141 of image converter tube 140 in defined distance increments. The correlation integral will then be obtained as a function of the random displacement of the actual object image relative to the reference object image. The output signal of detector 142 is used, in the same manner as described with reference to the embodiments of the invention shown in FIGS. 1, 2, and 3, to determine the correlation maximum and the displacement or drift of the actual object image relative to the reference object image.

Figure 5:
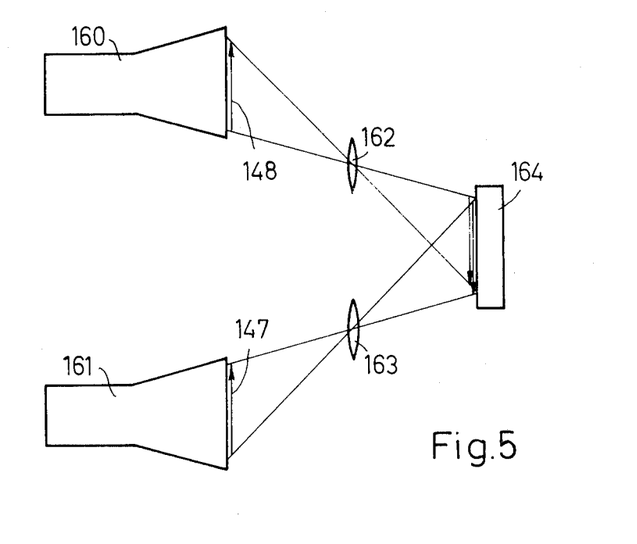
FIG. 5 is a partial schematic diagram of another embodiment of a microscope constructed in accordance with the present invention in which the correlation integral is determined by a summation of the actual and reference object images.

FIG. 5 illustrates, in schematic form, another embodiment of the invention which enables the correlation integral to be calculated through a summation. This embodiment includes two image amplifier tubes 160 and 161. An actual object image 148 is generated on tube 160, and a reference object image 147 is generated on tube 161. The actual and reference object images are brought into coincidence on planar detector 164 by means of two optical lenses 162 and 163. The detector determines the total amount of light arriving at the surface of the detector and, under certain conditions, the output signal of the detector will be proportional to the correlation integral.

Figure 6:
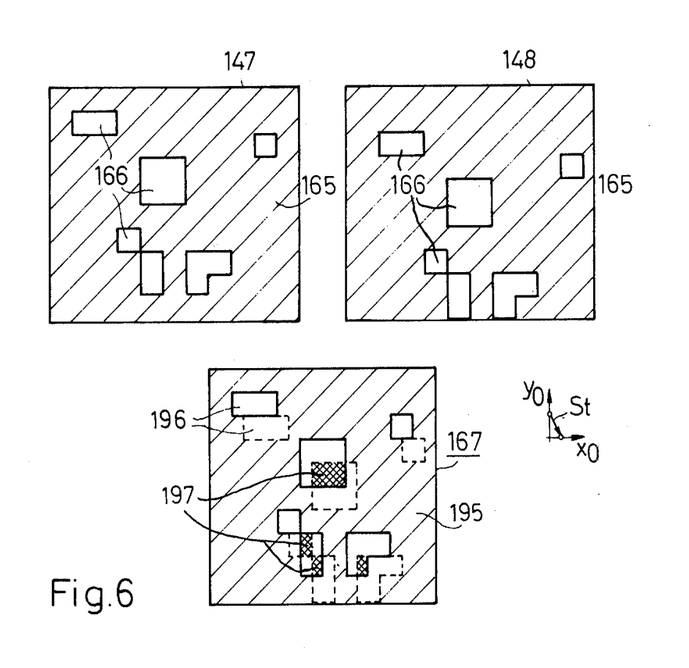
FIG. 6 is a planar illustration of the reference and actual object images used to determine the correlation integral in the embodiment of the invention illustrated in FIG. 5.

The conditions under which the foregoing will occur will now be described with reference to FIG. 6, which shows the form of the reference object image 147 and the actual object image 148. Both of these images have only two brightness values, namely, 0 (black) and 1 (white). The black areas 165 of the images are shaded and the white areas 165 of the images are unshaded. Actual object image 148 is displaced relative to reference object image 147 by a distance St having the coordinates $x_0, y_0$. If the actual and reference object images are brought into coincidence in the manner described with reference to FIG. 5, an image 167, which is shown in the lower part of FIG. 6, will be produced. The black areas 195 of this image are shaded and the areas 196 having a maximum brightness 1 of one of the images are unshaded. Areas 197 having a total 2 of maximum brightness 1 of images 147 and 148 are cross-hatched.

When the convolution integral of images 147 and 148 is calculated, it can be seen that only the areas of those images which are equal to cross-hatched areas 197 of image 167 contribute to the integral. Both factors of the integrand are different from 0 only in these areas; elsewhere, at least one factor of the integrand is 0. The value of the correlation integral is equal to the produce of the size of the cross-hatched areas and the product of the brightness in these areas. The brightness product is equal to $1.1=1$.

When the brightness of image 167 is considered, it can be seen that the brightness of cross-hatched areas 197 differs distinctly from that of the other areas. This brightness is proportional to the total brightness $1+1=2$. In the other areas of the image, the brightness is equal to the value 0 (in shaded areas 195) or 1 (in unshaded areas 196). From the foregoing, it follows that the correlation integral of the two black-white images 147 and 148 can be determined by the sum image 167. This latter image is present on detector 164 shown in FIG. 5 and has a brightness in cross-hatched areas 197 which is different from that part of the image around these areas. If the detector responds only to the brightness which is equal to the brightness of cross-hatched areas 197, the output signal of the detector will be proportional to the correlation integral of the actual and the reference object images.

Figure 7A:
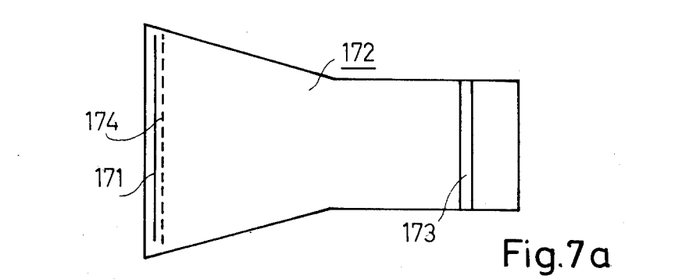
FIG. 7a is a schematic illustration of a camera tube which may be used as a detector in a microscope constructed in accordance with the invention.
Figure 7B:
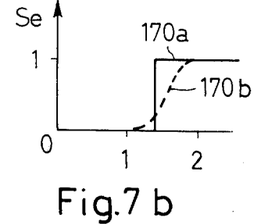

In order to achieve the foregoing, the detector must have a characteristic of the type illustrated in FIG. 7b. The sensitivity Se of a detector having this characteristic is 0 for brightness values of 0 and 1 and is different from 0, e.g., 1, for a brightness value of 2. The transition between the sensitivity 0 and 1 may be a step function, represented by characteristic curve 170a, or it may be a gradually increasing function represented by a characteristic curve 170b. A suitable detector may comprise a camera tube 172, shown in FIG. 7a, which comprises a photocathode 171 to which sum image 167 is transmitted. The camera tube includes an accelerating grid 174 and an integrating detector 173 for detecting impinging electrons. Accelerating grid 174 is provided with a suitable bias relative to photocathode 171 which is chosen so that electrons are drawn off the photocathode only from those points which are exposed to twice the maximum brightness of individual images 147 and 148.

A further method of determining the correlation integral of the actual and the reference object images from the superposition of the two object images will now be described with further reference to FIG. 6:

The correlation integral is proportional to the size of cross-hatched areas 197 of sum image 167. In these areas, the brightness has a value of 2. If the contrast of actual and reference object images 147 and 148 is reversed, i.e., shaded areas 165 have a brightness value of 1 and the unshaded areas 166 have a brightness value of 0, then sum image 167 will have a brightness value of 1 (in unshaded areas 196) or a brightness value of 2 (in shaded areas 195).

Figure 7C:
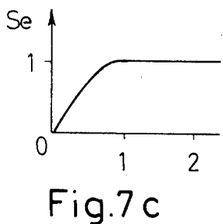

The correlation integral is determined according to this method by utilizing an integrating detector having a characteristic such as that illustrated in FIG. 7c. This characteristic represents a saturation characteristic, i.e., for a brightness value of 0, the sensitivity will be 0, and for a brightness value of 1 or 2, the sensitivity will be different from 0, e.g., 1. This characteristic can be achieved by using camera tube 172 illustrated in FIG. 7a. In order to do so, the potential of the accelerating grid need merely be chosen so that electrons are drawn off from those points of the photocathode at which the brightness has a value which is different from 0. No electrons are to be drawn off, however, from those points of the photocathode having a brightness value of 0. In addition, the potential of accelerating grid 174 is chosen so that a number of electrons is drawn off from the photocathode which is independent of the actual brightness value from the points of the photocathode having a brightness value which is different 0. The correlation integral is then obtained from the difference between two output signals generated by detector 173. One of the signals represents the maximum signal and is obtained when a brightness value different from 0 is present at all points of photocathode 171. The other of these signals is obtained when photocathode 171 is illuminated with the sum image of the actual and reference object images with the contrast of the images reversed.

Figure 8:
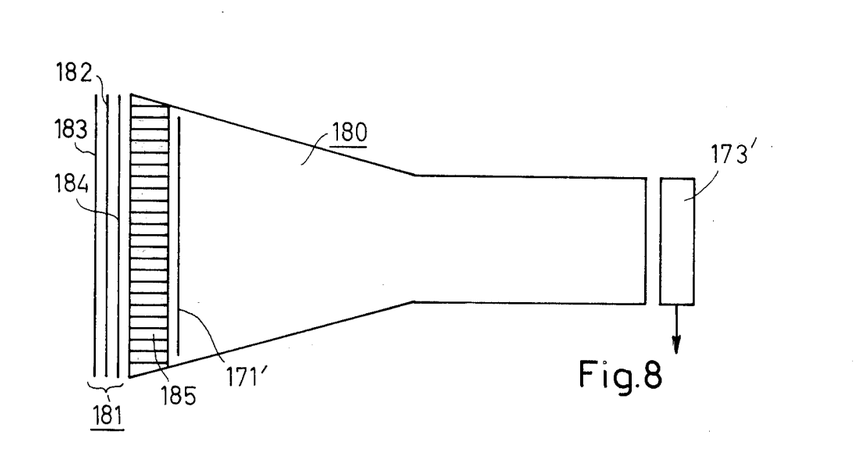
FIG. 8 is a schematic diagram of another embodiment of a camera tube which may be utilized as a detector in a microscope constructed in accordance with the present invention.

FIG. 8 illustrates another embodiment of a camera tube which may be used instead of tube 172 illustrated in FIG. 7a. In this embodiment, camera tube 180 is the same as tube 172 but has a linear characteristic over the entire brightness range of the light impinging upon photocathode 171'. Tube 180 is optically preceded by a detector 181 having a saturation a characteristic which enables determination of the correlation integral from the contrast-reversed actual and reference object images. Detector 181 comprises a fluorescent film 182 which has a saturation characteristic the same as that illustrated in FIG. 7c. The film is disposed between absorption filters 183 and 184, the first of which, filter 183, absorbs light located within the fluorescence range of film 182, and the latter of which, filter 184, passes only light located within the fluorescence range of film 182. A fiber optics system 185 couples film 182 to photocathode 171' of tube 180.

If the reference and the actual object images are projected, with contrast reversed, in the manner shown in FIG. 5 on fluorescent film 182, the film will be struck only by light having frequencies which are different from the fluorescence frequencies of film 182, which emits fluorescent light. Light which passes through adsorption filter 183 and does not excite film 182 to fluorescence is superimposed upon the fluorescent light emitted by the film. Absorption filter 184 eliminates this interference light and permits only fluorescent light to impinge upon photocathode 171'. The output of camera tube 180 is coupled to an integrating detector 173', and a signal is produced at the camera output which is proportional to the total amount of light falling on photocathode 171'.

Figure 9:
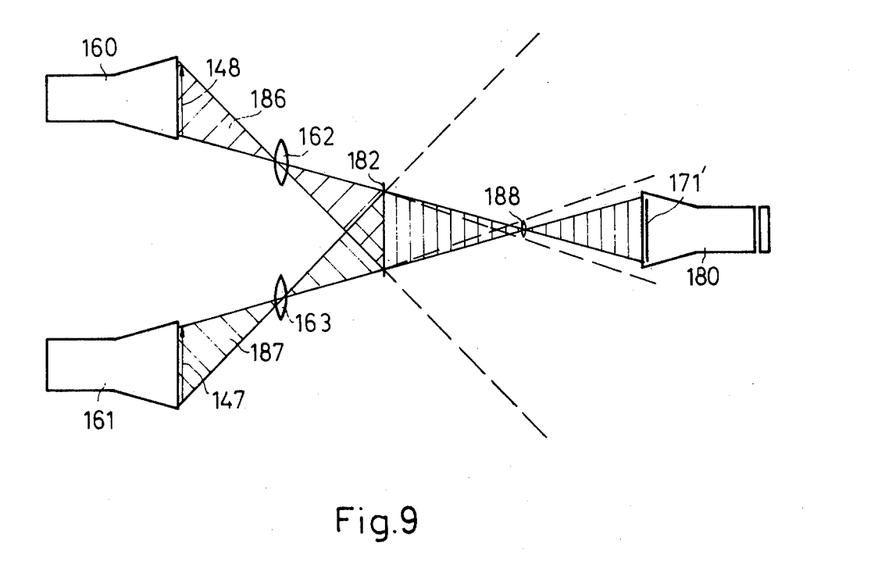
FIG. 9 is a partial schematic illustration of a further embodiment of a microscope constructed in accordance with the present invention in which the correlation integral is determined by means of a summation of the actual and reference object images.

An alternative embodiment of the invention which may be used instead of the arrangement described with reference to FIG. 8 is illustrated in FIG. 9. In this embodiment, a contrast-reversed actual and reference object image is projected onto fluorescent screen 182 as described with reference to the embodiment of the invention illustrated in FIG. 5. Fluorescent light is projected by an optical lens 188 onto photocathode 171' of camera tube 180, which also has a linear characteristic. Tube 180 is positioned outside the projected light beams 186 and 187 of the actual and reference object images. Thus, only light which is developed in the fluorescent film impinges upon camera tube 180. Thus, the excitation light, i.e., the actual and reference object image, is separated from the fluorescent light of the film due to the fact that the excitation light, but not the fluorescent light, remains focused with a grainless fluorescent film.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a corpuscular beam microscope including means for adjusting the position of the object image in the microscope and means, coupled to said adjusting means, for determining and correcting drift of the object image by means of a control signal which controls said adjusting means and is derived from a convolution of an actual object image with a stored reference object image, the improvement comprising said means for determining and correcting including means for deriving said convolution by imaging said actual object image directly on said reference object image.

2. The microscope recited in claim 1, wherein said actual object image comprises a radiation-emitting actual object image, and wherein said means for determining and correcting includes a radiation-permeable substrate on which said reference object image is stored, and detector means, disposed adjacent and subsequent to said substrate along the path of said beam, for determining the total amount of radiation passing through said reference object image.

3. The microscope recited in claim 2, wherein said detector means comprises a planar radiation detector having a surface area which is at least equal to that of said actual and reference object images.

4. The microscope recited in claim 2, wherein said means for determining and correcting includes an electron-optical image correlation tube having a storage screen comprising said substrate for storing said reference object image, and a photocathode, for receiving said actual object image.

5. The microscope recited in claim 4, wherein said electron-optical image correlation tube includes deflection means for displacing said actual object image in defined distance increments.

6. The microscope recited in claim 2, wherein said actual object image comprises a light-emitting actual object image, and wherein said substrate comprises a light-transmitted film.

7. The microscope recited in claim 6, wherein said means for determining and correcting includes an image amplifier tube including a fluorescent screen, said image amplifier tube being adapted to generate said actual object image on said screen.

8. The microscope recited in claim 7, wherein said image amplifier tube includes deflection means for displacing said actual object image in defined distance increments.

9. In a method for determining and correcting image drift in a corpuscular beam microscope by generating a control signal derived from the convolution product of an actual object image and a reference object image and using this control signal to adjust the position of the actual object image and correct the image drift, the improvement comprising the steps of determining the convolution of said actual and reference object images by reducing brightness values of said images to two predetermined values, and subsequently bringing said images into coincidence on a planar radiation detector.

10. The method recited in claim 9, wherein said step of bringing said images into coincidence comprises bringing said images into coincidence on a detector comprising a light-sensitive surface of a camera tube, which surface responds only to a brightness value which is greater than a maximum brightness value of one of said actual and reference object images.

11. The method recited in claim 9, further comprising the step of reversing the contrast of said images, subsequent to said step of reducing, but prior to said step of bringing said images into coincidence.

12. The method recited in claim 11, wherein said step of bringing said images into coincidence comprises bringing said images into coincidence on a detector comprising a light-sensitive surface of a camera tube having a saturation characteristic which causes saturation to commence at a brightness value which is equal to a maximum brightness value of one of said actual and reference object images.

13. The method recited in claim 11, wherein said step of bringing said images into coincidence comprises bringing said images into coincidence on a detector comprising a fluorescent film having a saturation characteristic which causes saturation to commence at a brightness value which is equal to a maximum brightness value of one of said actual and reference object images.

14. The method recited in claim 13, wherein said step of bringing said images into coincidence further comprises bringing said images into coincidence on a detector comprising a fluorescent film which is optically coupled to a light entrance plane of a camera tube which receives no light emanating directly from said images.

15. The method recited in claim 13, wherein said step of bringing said images into coincidence further comprises bringing said images into coincidence on a detector comprising a fluorescent film which is disposed between a first filter which absorbs light located within the fluorescence range of said film and a second filter which passes light only within the fluorescence range of said film.

* * * * *